(12) United States Patent
Simburger et al.

(10) Patent No.: US 6,284,966 B1
(45) Date of Patent: Sep. 4, 2001

(54) POWER SPHERE NANOSATELLITE

(75) Inventors: Edward J. Simburger, Agoura; David A. Hinkley, La Mirada; Ernest Y. Robinson, Altadena; David G. Gilmore, West Hollywood; Jon V. Osborn, Thousand Oaks, all of CA (US)

(73) Assignee: The Aerospace Corporation, El Segundo, CA (US)

( * ) Notice: Subject to any disclaimer, the term of this patent is extended or adjusted under 35 U.S.C. 154(b) by 0 days.

(21) Appl. No.: 09/520,120

(22) Filed: Mar. 6, 2000

(51) Int. Cl.[7] .................. H01L 31/045; H01L 31/04; B64G 1/00; B65D 51/00
(52) U.S. Cl. ............... 136/244; 136/245; 136/292; 244/173; 220/212; 220/252; 220/259; 220/380; 135/99; 135/87
(58) Field of Search .................. 136/244, 245, 136/292; 244/173; 220/212, 252, 259, 380; 135/99, 87

(56) References Cited

U.S. PATENT DOCUMENTS

| | | | |
|---|---|---|---|
| 5,052,640 | * 10/1991 | Chang | 244/173 |
| 5,527,001 | * 6/1996 | Stuart | 244/158 R |
| 6,002,360 | * 12/1999 | Wolcott et al. | 342/354 |
| 6,127,621 | * 10/2000 | Simburger | 136/246 |

OTHER PUBLICATIONS

Hinkley et al, "A Mechanical Deployment Structure for the Powersphere Concept," Energy Conversion Conference and Exhibit (IECEC) 35th Intersociety, vol. 1, (2000), pp. 659–669.*

* cited by examiner

Primary Examiner—Alan Diamond
(74) Attorney, Agent, or Firm—Derrick Michael Reid (57) ABSTRACT

A power sphere preferably used as part of a nanosatellite is formed using a plurality of flat panels solar arrays interconnected together by rotating hinges to approximate a spherical shape for use as an enclosure of a payload. The solar array panels are supported by an extending internal strut. The spherical shape provides attitude insensitive solar energy collection and heat radiation.

16 Claims, 9 Drawing Sheets

Stowed Configuration

Fig. 1A  Stowed Configuration

Fig. 1B  Extending Strut Configuration

Fig. 1C  Deployed Strut Configuration

Fig. 2A  Secondary Hexagon Deployment

Fig. 2B  Primary Pentagon Deployment

Fig. 2C  Tertiary Deployment

Fig. 3  Deployed Hemisphere

Fig. 4 Deployed Panel Sphere

Fig. 5A Stacked Polygon Panels

Fig. 5B Inflatable Panel Frame

Fig. 5C A—A View of Inflatable Struts and Hinges

Fig. 5D B—B View of Inflatable Hinge

POWER SPHERE NANOSATELLITE

REFERENCE TO RELATED APPLICATION

The present application is related to applicant's copending application entitled "Power Sphere Deployment Method" Ser. No. 09/517,611, filed Mar. 6, 2000, by the same inventors.

The present application is related to issued patent entitled "Power Sphere" U.S. Pat. No. 6,127,621 issued Oct. 3, 2000 filed Apr. 2, 1999, by a common inventor, and is related to copending application entitled "Power Distribution System" Ser. No. 09/281,653, filed Mar. 30, 1999, both of which having a common inventor, and all which have the same assignee.

FIELD OF THE INVENTION

The invention relates to the field of the construction and deployment of a satellite. More particularly, the present invention relates to the construction and deployment of a satellite in the form of a Sphere using a plurality of flat panels.

BACKGROUND OF THE INVENTION

The development of microsatellites and nanosatellites for low earth orbits requires the collection of sufficient power for onboard payload instruments that are low in weight and low in volume. Because the overall surface area of a microsatellite or nanosatellite is small, body-mounted solar cells may be incapable of providing enough power to the payload instruments. A power choke problem is caused by inherent low solar panel efficient and inherent low solar energy per area resulting in the need for very large collection surfaces. Deployment of traditional, rigid, solar arrays necessitates larger satellite volumes and weights. Due to the solar radiation incident, large satellites also require additional navigation apparatus for pointing at a fixed attitude for maximum collection of solar energy.

Cylindrical spinning satellites have long been deployed to provide various functions such as communications and imaging. The cylindrical satellite has a plurality of flat thin elongated solar cell panels running the length of the satellite forming a cylinder. The plurality of solar cell panels is equiangularly radially positioned around the diameter of the cylinder. The cylindrical spinning satellite is deployed at a specific attitude relative to the earth and sun so that the satellite collects maximum solar energy to power onboard payload instruments. As the satellite collects solar radiation, the energy is expended by the instruments producing thermal radiation. The instruments must not over heat. The satellite design provides for sufficient thermal radiation so that the payload instruments are maintained within thermal limits. The payload instruments radiate thermal energy within the satellite cylindrical cavity. Due to a lack of symmetry, cylindrical spinning satellites require specific attitudes relative to the sun to reduce the variance of the solar radiation and hence to reduce the temperature variations of equipment within the cylinder. Hence, the cylindrical spinning satellite disadvantageously requires precision attitude guidance and deployment. The cylindrical spinning satellites typically have relatively large solar panels in elongated shapes requiring large stowage capacity within a deployment launch vehicle. The payload within the cavity is surrounded by a large and unwieldy solar panel rendering deployment difficult as well as disadvantageously requiring large launch cavities.

Spherical shapes have been proposed for nanosatellites, and geodetic shapes have been used for fabricating roughly spherical structures for many years. However, deployable spherical structures have not been designed for space satellites, and deployment methods for terrestrial geodetic shapes have not been made to enable easy deployment. These and other disadvantages are solved or reduced using the invention.

SUMMARY OF THE INVENTION

An object of the invention is to provide a satellite that is solar radiation insensitive to attitude position.

Another object of the invention is to provide a thermal environment that is independent of attitude for a Payload that is within the sphere.

Still another object of the invention is to provide a spherical enclosure for enclosing a payload using a plurality of flat polygonal panels.

Yet another object of the invention is to provide a method of deploying a satellite in the shape of a sphere formed from a plurality of flat polygonal panels.

Still another object of the invention is to provide a method for deploying a housing enclosure having an arbitrary outer curvature formed from a plurality of flat polygonal panels.

The invention in a first aspect is an apparatus that is primarily directed to a power sphere that can be used as a spherical satellite having an external shape in the form of a sphere approximated by a plurality of flat polygonal panels enclosing a payload. The panels are preferably solar panels for collecting solar energy and also function as passive radiators. In a second aspect, the invention is a method that is primarily directed to stowing and then deploying the flat polygonal panels to form the spherical enclosure after deployment. The enclosure housing approximates a sphere with a spherical curved exterior surface. Such a housing enclosure could be used as a spherical array of flat polygonal solar panels in the case of a satellite, but could be extended to various types of housing enclosures, such as, a geodesic camping tent used for human recreation in parks, wilderness and snow covered areas.

The spherical shape renders the satellite attitude-insensitive to solar radiation, in that, at any arbitrary attitude, the amount of external area exposure to solar radiation is a constant. While in view of the sun at any arbitrary sun angle, the same solar power is collected, regardless of the satellite attitude. A payload may be disposed within the sphere. The payload may radiate thermal energy in all directions passively transmitted through the panels. The spherical satellite payload enclosure enables solar energy collection and power generation while enabling passive thermal control. Due to the symmetry of the sphere, the solar radiation exposure and passive thermal radiation remains constant, irrespective of the attitude of the satellite relative to the sun, thereby stabilizing temperatures. The enclosure is particularly useful in nanosatellite and microsatellite designs.

The spherical design using the plurality of flat polygonal panels provides for improved power collection efficiency and improved stowage capacity efficiency of the satellite. The implementation of the solar array formed by flat polygonal panels eliminates the need for solar array tracking and pointing mechanisms while reducing mass and complexity with increased power efficiency. The collection of solar power is only a function of the cross-sectional area of the solar array presented to the sun. Transient temperature variations of spacecraft equipment located within the spherical enclosure are moderated because the thermal barrier provided by the enclosing solar array effectively provides a layer of isolation. That is, the solar array serves a secondary purpose of providing passive transient thermal control, further increasing thermal maintenance efficiency. Additionally, in a stowed launch configuration, for a given desired solar array area, the deployable solar array panels are stacked in the preferred configuration in a more compact form than a conventionally designed satellite having externally attached solar panels of the same area, thereby reducing required stowage capacity and thereby reducing overall launch costs.

The preferred implementation is based upon a satellite or spacecraft with two hemispherical sets of deployable solar arrays, one at each end of a deploying strut, such that when deployed, each set of solar array panels forms a geodetic hemisphere. The two hemispheres, when completely unfurled, form a complete geodetic sphere enclosing the spacecraft payload. The complete enclosure configuration approximates a sphere using the flat polygonal panels enclosing the spacecraft payload. The spacecraft payload can be of any shape smaller than the enclosing solar array sphere.

The preferred deployable solar arrays may either be attached to the spacecraft payload with telescoping supporting struts or attached by hard mounted struts coupling the deployable solar arrays to the spacecraft payload. Telescoping supporting struts allow for a small size satellite relative to the overall spherical volume of the solar array. The hard mounted struts can be used in cases where the satellite axis is rigidly designed to span the diameter of the deployed spherical solar array.

The spherical solar array is stowed in as small a volume as practicable during the launch phase of the satellite using flat polygonal panels. The individual rigid solar cells are mounted on the flat panels. The panels are interconnected by hinges used to form geodetic shape. Flexible solar cells panels may be flattened to cover a plurality of flat panels extending over and bending at hinge creases as an alternative to separate rigid solar panels on respective flat panels. In either case, the panels support the solar cells on flat surfaces of the panels. The panels are stowed as individual flat panels in a compact stacked pancake-like configuration for launch purposes. After launch, the stacked panels are deployed during an unfurling process to form the geodetic sphere.

The spherical shape of the solar power sphere provides a moderate thermal environment for a payload enclosed within the sphere and this internal environment is thermally controlled independent of the sun angle and relative attitude. The solar power sphere provides both electric power and thermal control for a spacecraft payload. The preferred form deploys two polygonal hemispheres that form the geodetic sphere together with an internal deployable strut. This strut extends to the full diameter of the finished geodetic sphere. Attached to each end of the strut is a set of stacked flat polygonal panels for a respective one of the two hemispheres. Each stack of polygonal panels is made of interconnected panels including a center cap polygonal panel that is, in the preferred form, a primary hexagonal panel. The polygonal panels are interconnected through the plurality of hinges each having a limited degree of swing so as to position the panels into the spherical form at the completion of the unfurling process. The angular travel of the hinge will allow hinge action during unfurling deployment until the precise angle for the particular geodetic shape is obtained. This unfurling process starts with the center cap panels and continues until all the polygonal panels have taken respective final positions in the finished geodetic sphere.

The solar power sphere eliminates the need for any solar array tracking and pointing mechanisms by making the collected solar-electric power a function only of the cross-sectional area of the spherical solar array. While in view of the sun, any sun angle provides the same solar-electric power, regardless of the spacecraft attitude. The solar power sphere also provides a relatively constant thermal environment for the payload. The payload is thermal coupled by thermal radiation to the inside surface of the sphere. Because there is no direct solar illumination of the payload, all sides of the payload can be used to reject waste heat inside the sphere. The sphere, in turn, rejects the waste heat to space in the form of thermal radiation. This rejection of thermal energy is independent of the orientation of the sphere. The rejection rate is dependent on the amount of solar illumination at various points during an orbit. During eclipse periods, the sphere functions as a thermal-radiation barrier, reducing the temperature decrease of the payload. During illumination periods, the sphere functions as a thermal-radiation barrier, reducing the temperature increase of the payload. The sphere, therefore, moderates both the hot and cold extreme environments to which the payload is exposed while eliminating attitude sensitivity. The power sphere solves the relative power choke problem by providing a sphere enclosure surface having a large area as compared to the volume of the payload. The sphere offers a high collection area, low weight, and low stowage volume, relative to the size of the payload and eliminates the need for a pointing mechanism. The deployed solar array enclosure of flat panels approximately provides a spherical external shape to maximize solar energy input from any sun angle while providing a moderated thermal environment to the enclosed spacecraft payload. These and other advantages will become more apparent from the following detailed description of the preferred embodiment.

DETAILED DESCRIPTION OF THE PREFERRED EMBODIMENT

Figure 1A:
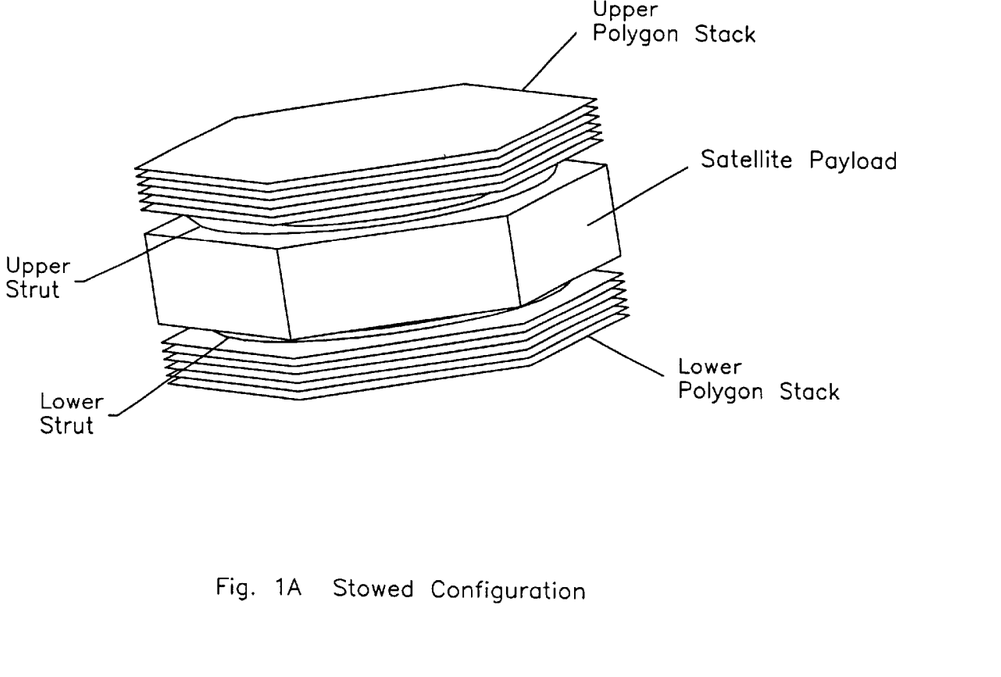
FIG. 1A depicts a stowed configuration of a power sphere such as during a launch, having compressed struts and stacked flat polygonal panels.
Figure 1B:
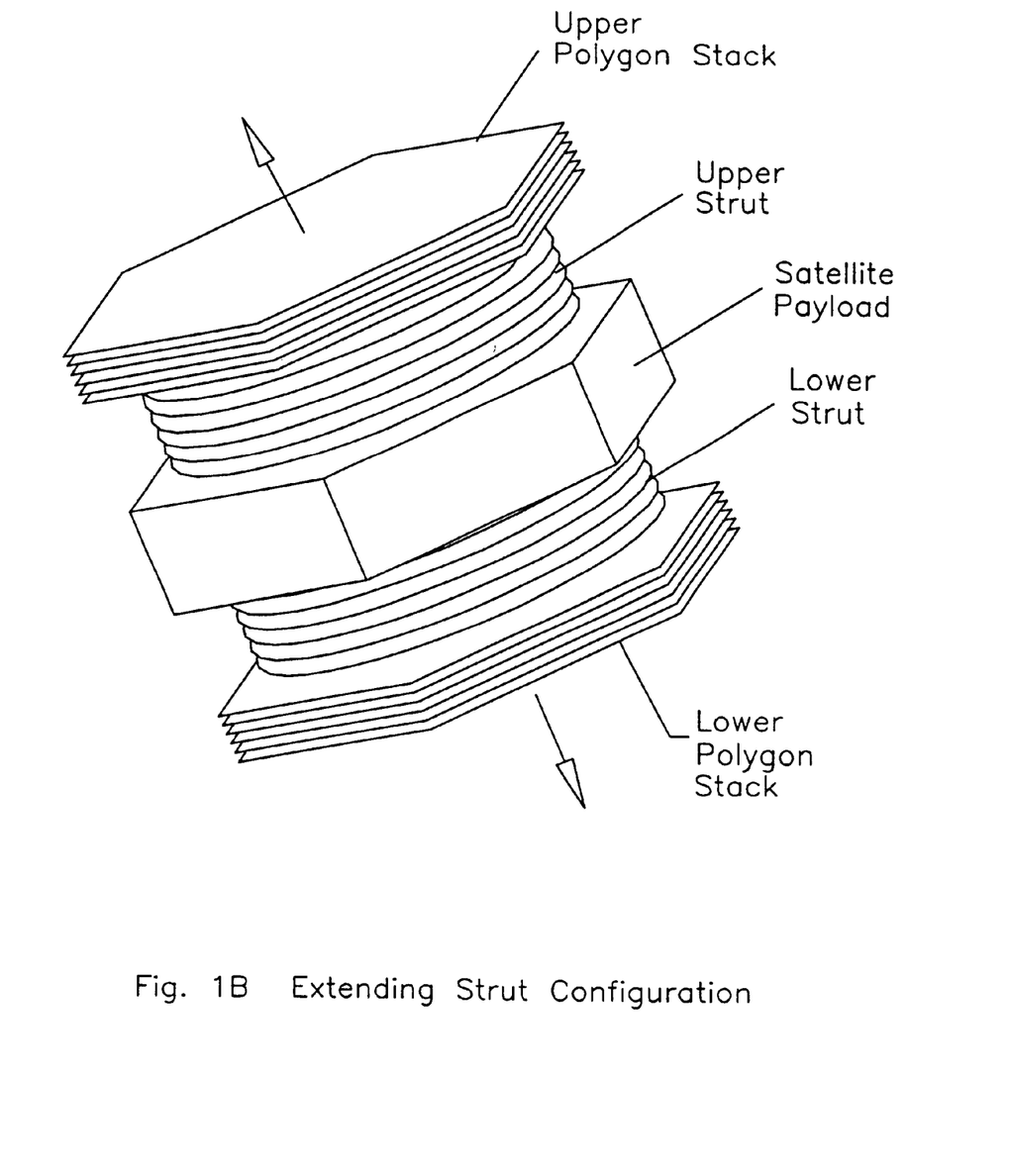
FIG. 1B depicts an extending strut configuration during deployment of the power sphere with the struts being partially extended.
Figure 1C:
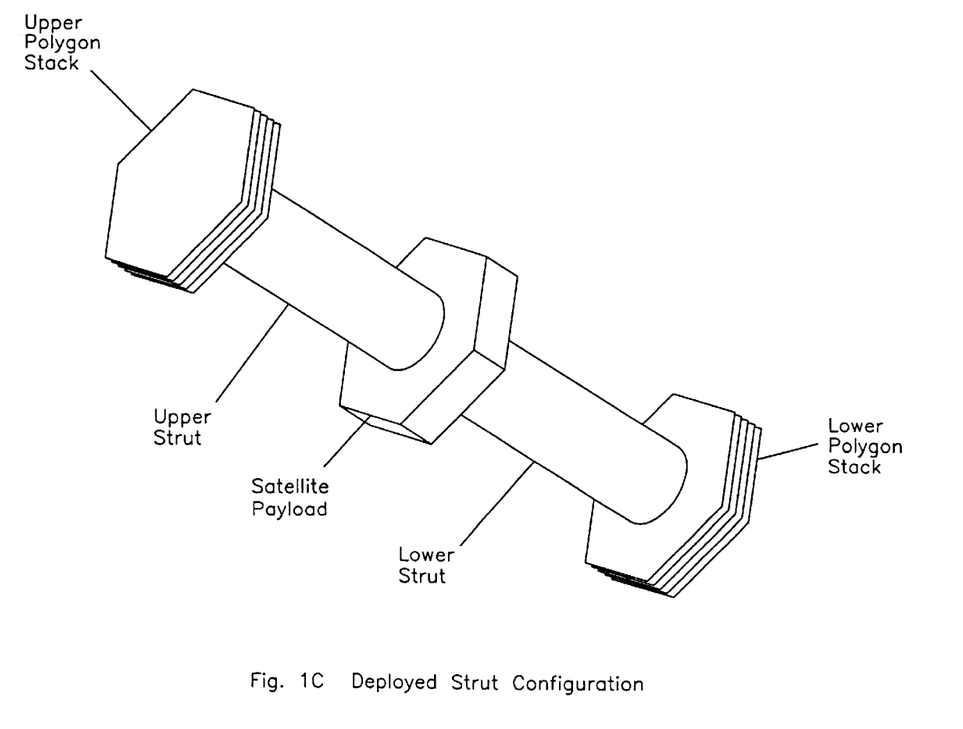
FIG. 1C depicts a deployed strut configuration when struts are first fully extending and when the flat polygonal panels are still in a stacked configuration.

An embodiment of the invention is described with reference to the figures using reference designations as shown in the figures. Referring to FIGS. 1A, 1B, and 1C, in a stowed configuration, a satellite payload is disposed between compressed upper and lower struts respectively connected to upper and lower polygonal stacks of flat panels. The stowed power sphere in the preferred embodiment is comprised of two stacks of polygonal panels connected to the struts at opposing distal and proximal ends. The stowed configuration of the power sphere is desirable during a launch phase of the payload. After separation from a launch vehicle, not shown, the deployable struts separate the two stacks of polygonal panels to a distance equal to the ultimate diameter of the deployed power sphere. The struts are preferably telescoping type struts having an ability to fully extent to a fixed length from the centered payload. During extension of the struts, in an extending strut configuration, the struts extend pushing the upper and lower polygonal stacks away from the payload in opposite directions. When the struts are fully extended in a deployed strut configuration, the upper and lower polygonal stacks are rigidly positioned at the fixed distance from the payload.

Figure 2A:
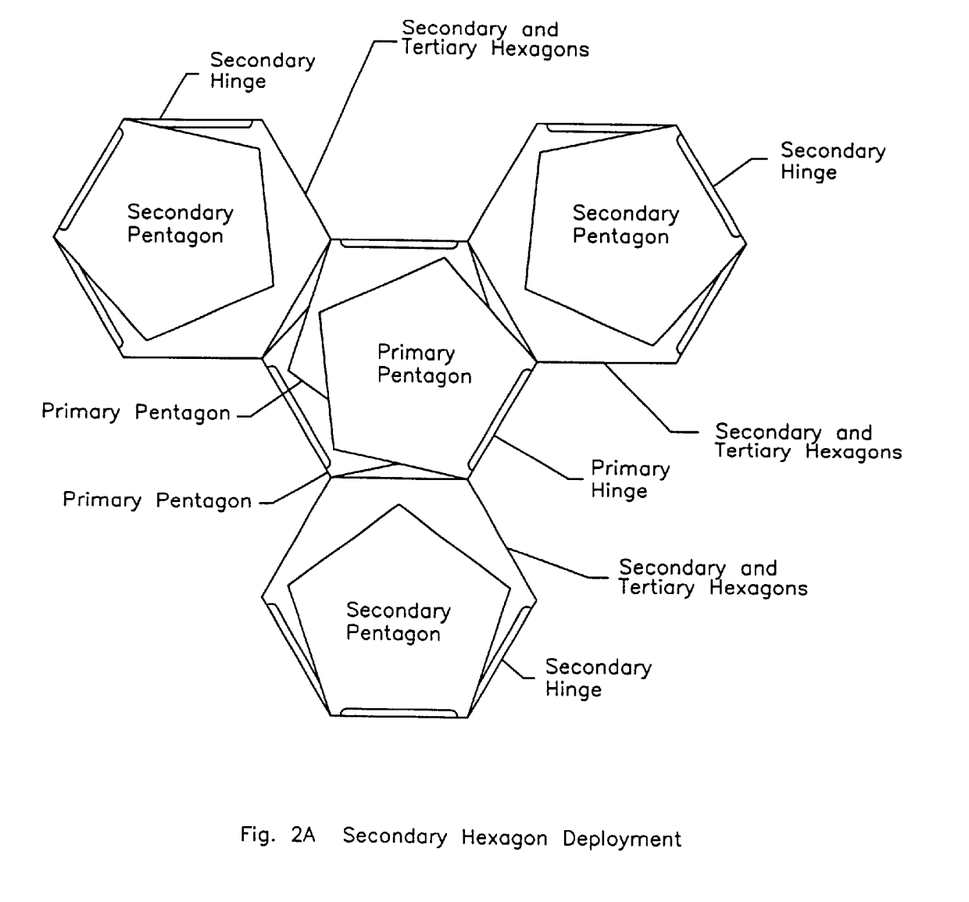
FIG. 2A depicts a primary deployment of primary hexagonal panels.
Figure 2B:
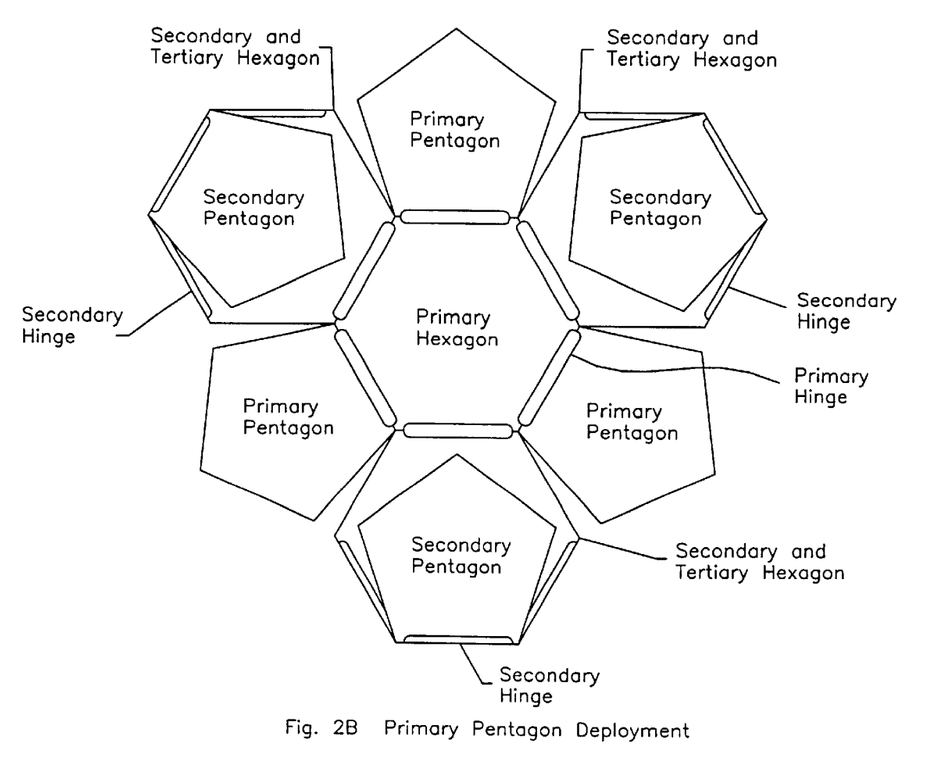
FIG. 2B depicts a secondary deployment of secondary hexagonal panels and primary pentagon panels.
Figure 2C:
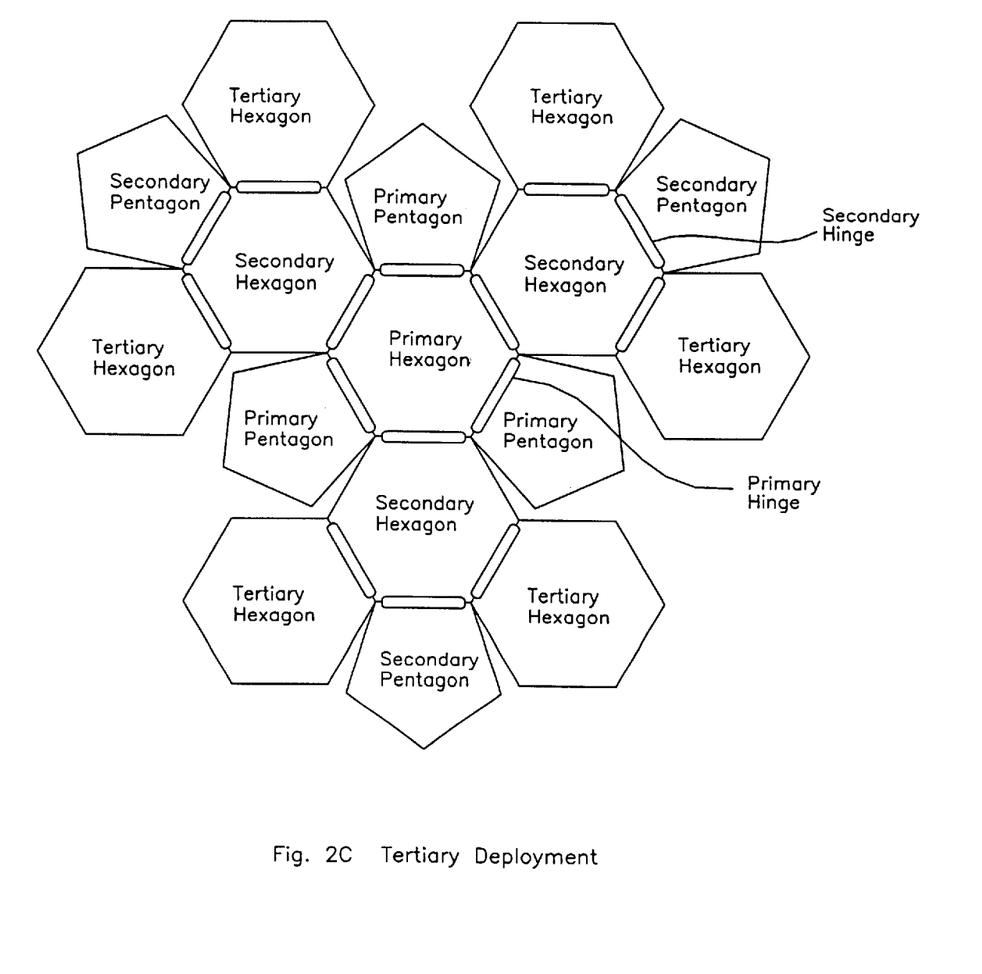
FIG. 2C depicts a tertiary deployment of tertiary hexagon panels and secondary pentagon panels.

Referring to FIGS. 1A through 2C, and more particularly to FIGS. 2A, 2B and 2C, the upper and lower polygonal stacks are unfurled starting with a secondary hexagon deployment, in the preferred form. Three secondary hexagonal panels are unfurled by rotation about three respective primary hinges. Next, three primary pentagonal panels are unfurled about three respective additional primary hinges. The three primary pentagonal panels and the three secondary hexagonal panels each rotate about a respective one of the six primary hinges attached to a primary hexagon panel serving as a cap flat hexagonal panel. Two cap flat hexagonal panels are respectively attached to the distal and proximal ends of the struts. Lastly, a pair of tertiary hexagonal panels and a secondary pentagonal panel are unfurled from each of the secondary hexagonal panel respectively by rotation about three respective secondary hinges to complete the unfurling deployment process. This unfurling process continues sequentially until all of the polygonal panels are completely unfurled. During or after the extension of the struts, all of the hinges will cause unfurling rotations of the connected panels. The hinges will cause rotation of the individual respective polygonal panels from the stowed stacked position to a fixed angle position defined by adjacent flat faces of the panels to ultimately form a geodetic sphere at the end of the unfurling deployment process. The hinges would then lock at the fixed angle position to provide structural rigidity necessary to maintain the final shape of the fully deployed power sphere.

Figure 3:
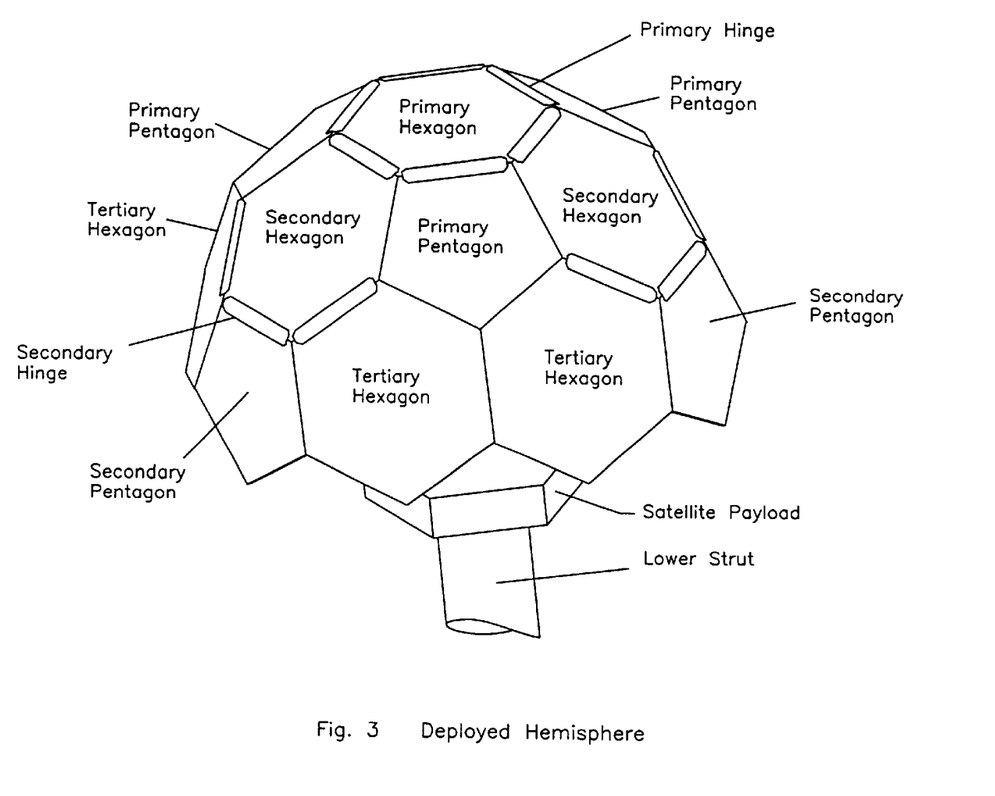
FIG. 3 depicts the curvature and deployment of a hemisphere of flat polygonal panels.
Figure 4:
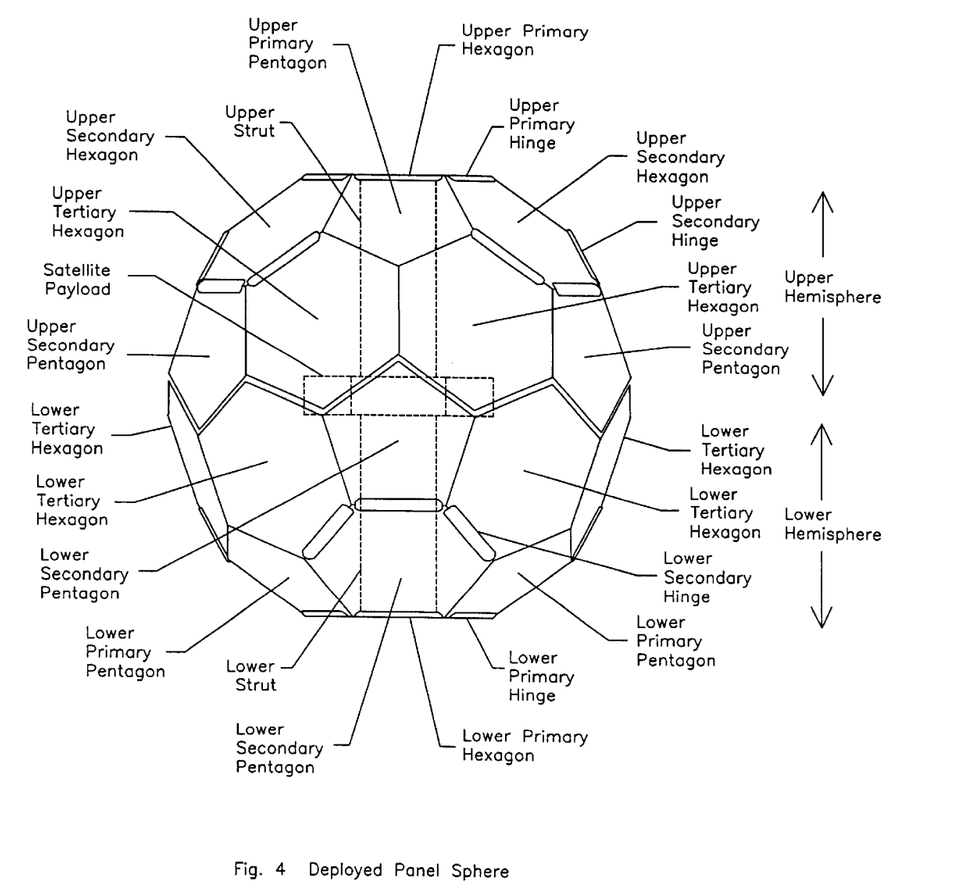
FIG. 4 depicts a fully deployed power sphere having an upper and a bottom hemisphere form the outer spherical enclosure from a plurality of flat polygonal panels.

Referring to FIGS. 1A through 4 and more particularly FIGS. 3 and 4, respectively depicting a deployed upper hemisphere and an entire sphere, the unfurling of the panels continues with panel rotation about the primary and secondary hinges until all of the upper panels form an upper hemisphere and all of the lower panels form a lower hemisphere when fully unfurled. At such time, the upper and lower hemisphere form a complete sphere supported by the internal strut comprising the upper and lower struts, with the payload disposed between the upper and lower struts in the preferred form. Hence, the fully deployed power sphere will be made up of a plurality of polygonal panels each being attached through hinges to form the final enclosing geodetic structure. The two hemispheres will be connected together by the internal strut including both the upper strut and the lower strut.

There are alternative ways in which the struts may be extended and the panels unfurled. In the preferred form, sublimating power is used within flexible tubular materials to provide rotational and extending forces to deploy the power sphere. Referring to all of the Figures, and more particularly to FIGS. 5A, 5B, 5C and 5D, the polygonal panel stacks can be interconnected and rigidized using collapsible, but inflatable tubes forming a frame around each of the panels. The tubular frame comprises an inflatable hinge where juxtaposed attached panels are interconnected and comprises an inflatable supporting strut where the panels are not interconnected. The tube is collapsible under atmospheric pressure and filled with a condensed sublimation powder. Upon deployment in space, the sublimation powder enters a gaseous state under reduce atmospheric pressure providing gaseous pressure within the tubular frame, so as to provide expanding gaseous forces within the frame to unfurl and rigidize the frames of the polygonal panels. The same sublimation method is used to extend the upper and lower struts. The design of the hinge relative to the attached juxtaposed pair of panels, shown in FIG. 5D as the top and bottom panels, is such that upon sublimation, the top and bottom panels are unfurled to a predetermined fixed angle, such as, in the exemplar form, 142 degrees.

The preferred panels provide a frame structure for added rigidity and unfurling and allow for stowage in a flat stacked configuration. Each of the individual polygonal panels are directly attached or indirectly attached to the cap polygonal panel through the interconnecting hinges. In the stowed position, all of the inflatable tubes that make up the frames would be deflated and compressed to be flat. Deployment inflation sublimation gas would expand within the frame tubes starting with the frame around the cap hexagonal panel. The gas pressure would begin to cause the secondary hexagonal panels and primary pentagonal panels connected to the primary hexagonal panel to begin the deployment unfurling sequence, followed in turn by the tertiary hexagonal panels and secondary pentagonal panels. As the gas pressure inflates the inflatable frame tubes surrounding the first group of secondary hexagonal and primary pentagonal panels, the tubes surrounding the second group of tertiary hexagonal panels and secondary pentagonal panels will begin expanding during the next deployment unfurling phase of the unfurling sequence. This inflation process continues until all subsequent groups of polygonal panels have been deployed.

Figure 5A:
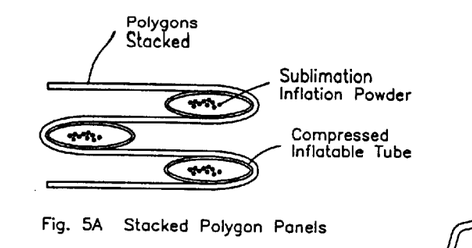
FIG. 5A depicts sublimated inflatable hinges for deploying the flat polygonal panels into respective final positions.
Figure 5B:
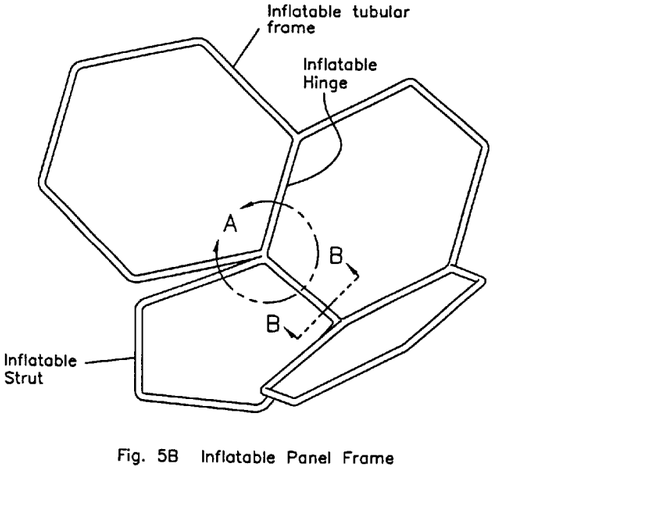
FIG. 5B depicts deployed flat polygonal panels interconnected by inflatable hinges and inflatable struts.
Figure 5C:
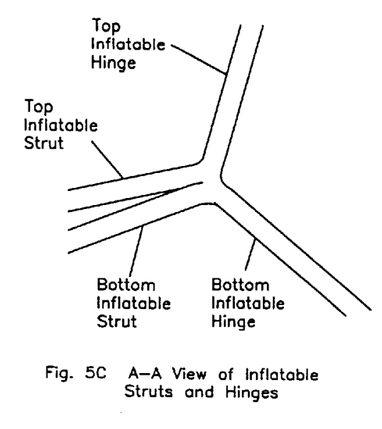
FIG. 5C depicts inflatable struts and inflatable hinges corresponding to an A—A view of FIG. 5A.
Figure 5D:
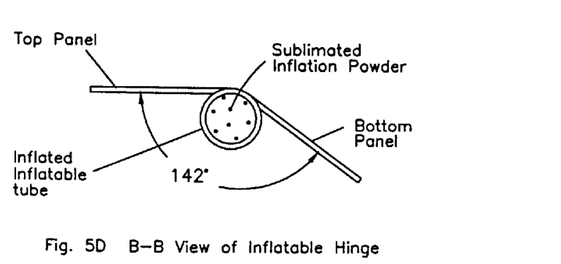
FIG. 5D depicts an inflatable tube functioning as an inflatable hinge corresponding to a B—B view of FIG. 5A.

After unfurling, the exemplar top and bottom panels would respectively have top and bottom hinges and frame struts, as particularly shown in FIG. 5C. The hinges allow for controlled deployment of the panels as an inflatable structure, but other embodiments may be used, such as spring or motor driven devices with a stop at the appropriate desired angle between juxtaposed panels. Gas canisters could also be used to inflate the hinge tubes. This gas canister inflation method is particularly useful where the geodetic curve surface forms part of a recreational tent for terrestrial applications. In the case of a terrestrial recreational tent, the frame tube pressure can be used to create a tight seal between unconnected juxtapose polygonal panels. The panel frame struts may further comprise edge zippers, velcro fasteners, and other suitable securing means, not shown, so that the unconnected juxtaposed polygonal panels can be securely closed together to form a wind proof geodetic enclosure for use in extreme weather conditions.

As may now be apparent, a wide variety of polygonal shaped panels could be devised to form a variety of differently shaped curved housing enclosures. In the preferred form, a bucky ball, that is a soccer ball design of pentagons and hexagons, is used to form the spherical solar array as an enclosure that will have the same cross-sectional area for collection of solar radiation independent of the orientation of the array relative to the sun. This solar array can be used to enclose the payload electronics and battery. The payload should be suspended at or near the center of the enclosing spherical solar array for improved thermal control. The payload could have radiator surfaces on all sides of the payload for the purpose of injecting waste heat into the interior of the sphere. The total amount of heat transported from the payload radiators to the interior surface of the spherical solar array is dependent upon the temperature difference between the payload radiator and the integrated average temperature of the inside surface of the spherical solar array. The integrated average temperature is constant and independent of the orientation of the spherical array relative to the sun. During eclipses, the integrated temperature of the spherical solar array will be cooler resulting in greater heat rejection from the payload radiators than occurs during sunlit portions of the orbit. Because the sphere acts as a radiation barrier, the rate of heat loss from the payload during the eclipse is still less than would otherwise be experienced if the payload were mounted outside of the sphere and exposed directly to the space environment.

While the above preferred form is generally applicable to power sphere nanosatellites, and terrestrial recreational tents, the method of forming a curve surface as part of an enclosure can be used in many different applications where a curved enclosure is desired but initially packed in a compact stowed configuration. Those skilled in the art can make enhancements, improvements, and modifications to the invention, and these enhancements, improvements, and modifications may nonetheless fall within the spirit and scope of the following claims.

What is claimed is:

1. An enclosure having a curved exterior surface, the enclosure comprising,
   a strut having an end,
   a flat cap panel attached to the end of the strut, the cap panel being polygonal in shape and having one or more hinges at a respective one or more sides of the flat cap panel, and
   a set of flat polygonal panels each having at least one hinge on at least one respective side, the set of flat polygonal panels and the first cap polygonal panel forming the curved exterior surface.

2. The enclosure of claim 1 wherein the flat polygonal panels are hexagonal and pentagonal panels.

3. The enclosure of claim 1, wherein the curved surface forms a tent barrier.

4. The enclosure of claim 1 wherein the flat polygonal panels form a hemisphere.

5. The enclosure of claim 4 wherein,
   the hemisphere separates interior space from exterior space, and
   the flat polygonal panels serve as a thermal barrier between the interior space and the exterior space.

6. An enclosure having a spherical curved surface, the enclosure comprising,
   a strut having a distal end and a proximal end,
   a first flat cap panel attached to the distal end of the strut, the first cap panel being polygonal in shape and having a plurality of hinges at each side of the first flat cap panel,
   a second flat cap panel attached to the proximal end of the strut, the second cap panel being polygonal in shape and having a plurality of hinges at each side of the second flat cap panel,
   a first set of flat polygonal panels each having at least one hinge on at least one respective side, the first set of flat polygonal panels and the first cap polygonal panel forming a first hemisphere of panels, and
   a second set of flat polygonal panels each having at least one hinge on at least one respective side, the second set of flat polygonal panels and the second cap polygonal panel forming a second hemisphere of panels, the first and second hemisphere of panels approximating a sphere.

7. The enclosure of claim 6 wherein,
   the first and second sets of flat polygonal panels are hexagonal and pentagonal panels, and
   the sphere is a bucky ball sphere.

8. The enclosure of claim 6 wherein,
   the first and second hemispheres separate interior space from exterior space, and
   the first and second sets of flat polygonal panels serve as a thermal barrier between the interior space and the exterior space.

9. The enclosure of claim 6 wherein the first and second sets of polygonal panels are solar panels.

10. A spacecraft, the spacecraft comprising,
    a payload,
    a first strut attached to the payload, the first strut having a first proximal end attached to the payload and having a first distal end extending from the payload,
    a second strut attached to the payload, the second strut having a second proximal end attached to the payload and having a second distal end extending from the payload,
    a first flat cap panel attached to the first distal end, the first cap panel being polygonal in shape and having a plurality of hinges at each side of the first flat cap panel,
    a second flat cap panel attached to the second distal end, the second cap panel being polygonal in shape and having a plurality of hinges at each side of the second flat cap panel,
    a first set of flat polygonal panels each having at least one hinge on at least one respective side, the first set of flat polygonal panels and the first cap polygonal panel forming a first hemisphere of panels,
    a second set of flat polygonal panels each having at least one hinge on at least one respective side, the second set of flat polygonal panels and the second cap polygonal panel forming a second hemisphere of panels, the first and second hemisphere of panels approximating a sphere.

11. The spacecraft of claim 10 wherein,
    each of the panels of the first and second cap polygonal panels and the first and second set of flat polygonal panels are solar array panels for collecting the solar power, and
    the spacecraft collects solar power from the sun for providing power to the payload.

12. The spacecraft of claim 11 wherein,
    the solar array panels collect a constant amount of solar energy at any arbitrary attitude of the spacecraft.

13. The spacecraft of claim 11 wherein,
    the payload radiates heat, and
    all of the panels form a thermal barrier between the payload and space, the thermal barrier serving to moderate thermal environments within the sphere about the payload.

14. The spacecraft of claim 10 wherein, the first and second flat cap panels and the first and second set of flat polygonal panels comprise hexagonal and pentagonal panels, and the first and second flat cap panels and the first and second set of flat polygonal panels form a bucky ball geodetic sphere.

15. The spacecraft of claim 10 wherein, the first and second flat cap panels are primary hexagonal panels, and each of the first and second sets of flat polygonal panels comprise three secondary hexagonal panels, three primary pentagonal panels, six tertiary hexagonal panels, and three secondary pentagonal panels.

16. The spacecraft of claim 15 further comprising, a first set of six primary hinges interconnecting in the first hemisphere the first flat cap panel to the three secondary hexagonal panels and the three primary pentagonal panels of the first set of flat polygonal panels, a second set of six primary hinges interconnecting in the second hemisphere the second flat cap panel to the three secondary hexagonal panels and the three primary pentagonal panels of the second set of flat polygonal panels, a first group of secondary hinges in the first hemisphere, the first group of secondary hinges comprising three sets of secondary hinges with each of the three sets of secondary hinges comprising three hinges and with each set of the three secondary hinges for respectively interconnecting one of the three secondary hexagonal panels to one of the secondary pentagonal panels and to two of the tertiary hexagonal panels of the first set of flat polygonal panels, and a second group of secondary hinges in the second hemisphere, the second group of secondary hinges comprising three sets of secondary hinges with each of the three sets of secondary hinges comprising three hinges and with each set of the three secondary hinges for respectively interconnecting one of the three secondary hexagonal panels to one of the secondary pentagonal panels and to two of the tertiary hexagonal panels of the second set of flat polygonal panels.

\* \* \* \* \*